United States Patent [19]
Pfiester

[11] Patent Number: 4,948,747
[45] Date of Patent: Aug. 14, 1990

[54] METHOD OF MAKING AN INTEGRATED CIRCUIT RESISTOR

[75] Inventor: James R. Pfiester, Austin, Tex.

[73] Assignee: Motorola, Inc., Schaumburg, Ill.

[21] Appl. No.: 451,900

[22] Filed: Dec. 18, 1989

[51] Int. Cl.$^5$ .................. H01L 21/40; H01L 21/90
[52] U.S. Cl. .................................. 437/60; 437/47;
437/52; 437/200; 437/228; 437/233; 437/235;
437/918; 357/51
[58] Field of Search ............... 437/47, 52, 60, 228,
437/233, 918, 200; 357/51

[56] References Cited

U.S. PATENT DOCUMENTS

| | | | |
|---|---|---|---|
| 4,290,185 | 2/1981 | McKenny et al. | 437/47 |
| 4,445,266 | 5/1984 | Mai et al. | 437/47 |
| 4,451,328 | 5/1984 | Dubois | 437/918 |
| 4,859,279 | 8/1989 | Choi | 437/918 |

Primary Examiner—Brian E. Hearn
Assistant Examiner—T. Thomas
Attorney, Agent, or Firm—John A. Fisher

[57] ABSTRACT

A process for fabricating an integrated circuit resistor is disclosed. In accordance with one embodiment of that invention a first thin layer of silicon is deposited to overlay a semiconductor substrate. That thin layer of silicon is doped to a predetermined level to establish the proper conductivity desired for the integrated circuit resistor being formed. The first layer of silicon is patterned to form a first resistor layer and a second interconnect area with the two areas being in contact. A layer of insulating material is formed over the resistor area to mask the resistor area from subsequent processing steps. A second layer of silicon is deposited by a process of selective deposition onto the exposed interconnect areas of the first thin layer of silicon and that selectively deposited silicon is heavily doped with conductivity determining impurity material to reduce the resistivity thereof.

10 Claims, 2 Drawing Sheets

METHOD OF MAKING AN INTEGRATED CIRCUIT RESISTOR

BACKGROUND OF THE INVENTION

This invention relates generally to integrated circuit resistors, and more specifically to high value integrated circuit resistors formed from polycrystalline silicon.

High value integrated circuit resistors are often fabricated from lightly doped polycrystalline silicon. The same layer of polycrystalline silicon used to effect the resistor is also used as the gate electrode of MOS devices and/or as an interconnect to couple together the various devices used to achieve the desired integrated circuit function. The implementation of polycrystalline silicon resistors in the conventional manner, however, has required choosing between alternatives and making compromises either in the properties of certain circuit components or in the ease of manufacture of the circuit.

Although it is possible to achieve high sheet resistivity in polycrystalline silicon films of nominal thickness by lightly doping the polycrystalline silicon, for example by ion implantation, it difficult to control the sheet resistivity in the desired range because of the steep relationship between doping and resistivity. Small changes in impurity doping can make very large changes in sheet resistivity. Because of this, resistors have been implemented by using more heavily doped and thus more controllably doped polycrystalline silicon which has a lower sheet resistivity and then relying on geometric factors to achieve the high resistance. For example, high value resistors are fabricated from thin layers of polycrystalline silicon or are formed from thicker layers patterned to have a large length to width ratio either by making the resistor long or by making the resistor narrow. The use of thin polycrystalline silicon has a number of disadvantages, including, most notably, the problem that the thin and high resistance polycrystalline silicon is inappropriate for use as an interconnection. Additionally, thin polycrystalline silicon is difficult to contact because of factors relating to the alloying properties of aluminium and silicon. Long resistors require too much area on the integrated circuit chip being fabricated and narrow resistors are difficult to control because small dimensional changes can represent a large percentage change.

Some of these problems have been overcome in the past, for example, by thinning the polycrystalline silicon in the region where the resistor is fabricated and leaving the polycrystalline silicon at nominal thickness where it is used to implement interconnections and gate electrodes. This procedure is less than satisfactory because of the difficulty encountered in controllably thinning the polycrystalline silicon. Additionally, one layer of polycrystalline silicon can be used to implement the resistor and another or additional layer of polycrystalline silicon can be used to implement the interconnection and gate electrodes. This, however, requires, in addition to the deposition of an extra layer of polycrystalline silicon, the patterning of the additional layer and especially the alignment of the patterning of the first and second layers.

Accordingly, a need existed for an improved process for fabricating integrated circuit resistors which would provide high value resistors, would be manufacturable, and would be consistent with interconnecting the high value resistors with other circuit components.

It is therefore an object of this invention to provide an improved process for fabricating polycrystalline silicon integrated circuit resistors.

It is another object of this invention to provide an improved process for fabricating integrated circuit resistors interconnected with other circuit devices.

BRIEF SUMMARY OF THE INVENTION

The foregoing and other objects and advantages of the invention are achieved, in accordance with the invention, by a process which includes the selective deposition of polycrystalline silicon to form circuit interconnections and other high conductivity circuit elements. In accordance with one embodiment of the invention a thin layer is deposited overlaying a semiconductor substrate. A predetermined level of conductivity determining dopant impurity is provided in the first thin layer of silicon which is patterned to form a first resistor area and a second interconnect area with the two areas being in contact. A layer of insulating material deposited overlaying the resistor area of the polycrystalline silicon and a second layer of silicon is deposited by a process of selective deposition onto the exposed second interconnect area. A predetermined level of conductivity determining dopant impurity is then provided in the second layer of silicon to render that layer of silicon appropriate for the interconnecting function.

DETAILED DESCRIPTION OF PREFERRED EMBODIMENTS

Figure 1:
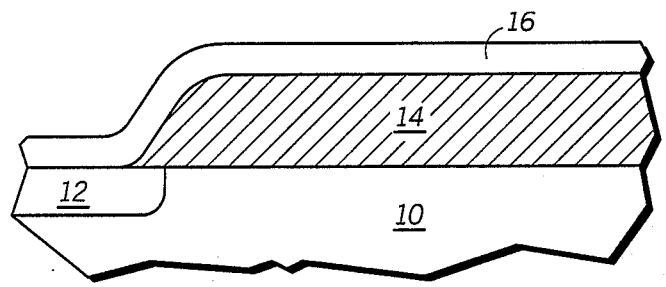
FIGS. 1 and 3-7 illustrate, in cross-section, process steps in accordance with one embodiment of the invention.

The integrated circuit resistor made in accordance with the invention is applicable to a wide range of integrated circuit devices, and is especially applicable to a static random access memory (SRAM) devices made using MOS technology. It will be appreciated, however, that the integrated circuit resistor made in this manner is applicable to other devices and to other technologies. The process in accordance with the invention is illustrated by the fabrication of a portion of an integrated circuit device. FIG. 1 illustrates, in cross-section, the initial structure of a portion of such an integrated circuit device at an early stage in the process of fabricating a polycrystalline silicon resistor. The resistor can be fabricated, in accordance with invention, utilizing either amorphous or polycrystalline silicon, but polycrystalline silicon is preferred and that term will be used throughout this description to encompass either type of silicon.

As illustrated in FIG. 1, the process in accordance with the invention starts with a semiconductor substrate 10 in which a device region 12 has been formed. A layer of insulating material 14 is formed on the surface of substrate 10 and has an opening therethrough which exposes a portion of device region 12. A layer of polycrystalline silicon 16 is formed overlaying insulator 14 and extending through the opening in insulator 14 to contact device region 12. Polycrystalline silicon layer 16 is preferably deposited by chemical vapor deposition and has a thickness of about 50 nanometers. Polycrystalline silicon layer 16 is doped with conductivity determining impurities to the correct doping level to establish the necessary sheet resistivity to form the desired resistor. The doping is accomplished either during deposition or after deposition, the latter by ion implantation, thermal diffusion, or the like. Although polycrystalline silicon layer 16 is illustrated contacting device region 12, as it will in preferred embodiments, it is not essential that the resistor contact the device region formed in substrate 10.

Figure 2:
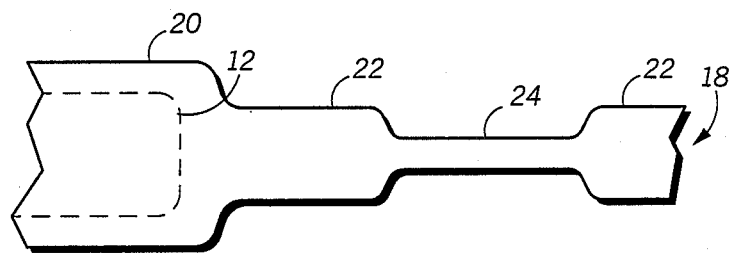
FIG. 2 illustrates, in plan view, the structure of a resistor and interconnecting line in accordance with the invention.

Polycrystalline silicon layer 16 is patterned to define the desired size and shape of the resistor to be implemented as well as the desired shape and location of the interconnection to be formed with this and subsequent layers of polycrystalline silicon. Layer 16 is photolithography patterned and etched in conventional manner. FIG. 2 illustrates, in plan view, polycrystalline silicon layer 16 after the patterning. The patterned polycrystalline silicon, in accordance with the preferred embodiment, includes a portion 20 which contacts region 12 shown by the dashed lines, interconnect portions 22 and a resistor portion 24. Resistor portion 24 is shown narrower than interconnect portions 22 in order to increase to resistance of the resistor to be formed, but in general the length and width of resistor portion 24 is determined consistent with resistor requirements of the integrated circuit being fabricated.

Figure 3:
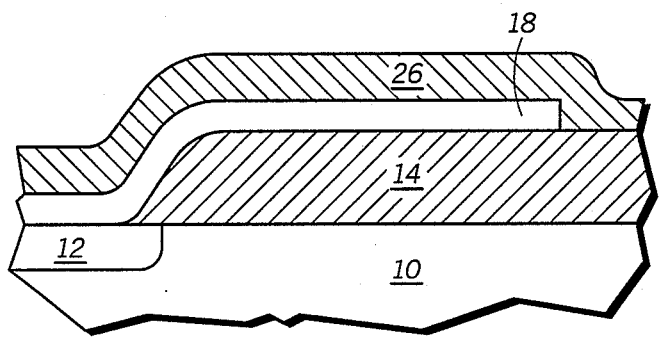
Figure 4:
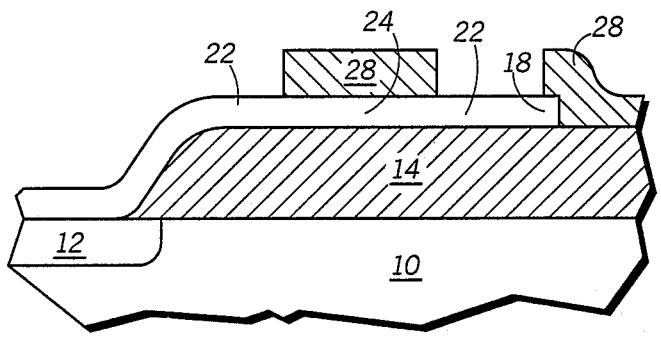

As illustrated in FIG. 3, the process in accordance with the invention continues by the deposition of a masking layer 26 overlaying the patterned polycrystalline silicon layer 18. Masking layer 26 can be an oxide, nitride, or the like, but must be selected from those materials which will not nucleate the selective deposition of silicon as described more fully below. Masking layer 26 is preferably a layer of low temperature oxide (LTO) or other insulating material deposited by chemical vapor deposition. In a preferred embodiment, masking layer 26 is formed from LTO having a thickness of about 200-300 nanometers.

Masking material 26 is patterned, using conventional photolithography and etching, to leave a masking element 28 overlaying that portion of patterned polycrystalline silicon layer 18 corresponding to resistor portion 24. The patterning of making layer 26 in this manner exposes interconnection portions 22 of polycrystalline silicon layer 18.

Figure 5:
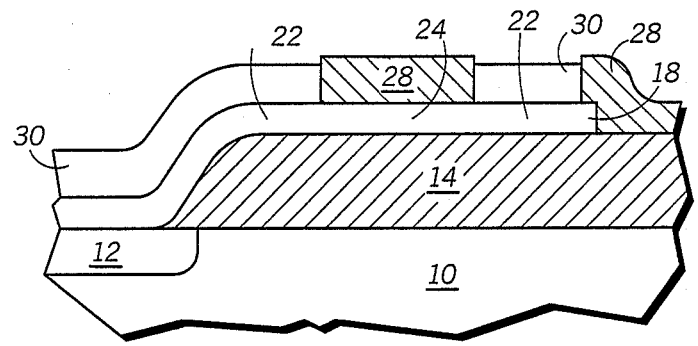

In accordance with the invention a second layer of silicon, and preferably polycrystalline silicon, is selective deposited on the exposed portions of polycrystalline silicon layer 18 as illustrated in FIG. 5. Selective deposition is a chemical vapor deposition process in which the deposition parameters are adjusted, in known manner, so that deposition occurs only on a prepared nucleating surface. For example, polycrystalline silicon can be selectively deposited on an exposed silicon surface. During the deposition process the polycrystalline silicon does not deposit on oxide, nitride, or other non-nucleating surfaces. Thus in the present process, selectively deposited polycrystalline silicon 30 deposits only on the exposed portion of patterned polycrystalline silicon layer 18 and not on masking element 28 or exposed portions of insulator 14. Selectively deposited polycrystalline silicon layer 30 is deposited to a thickness of about 200 nanometers to increase the thickness of the composite layer of polycrystalline silicon 18 plus polycrystalline silicon 30 in those areas where high conductivity is desired. Selectively deposited polycrystalline silicon layer 30 is doped with conductivity determining impurities either by insitu doping during the selective deposition process or by ion implantation, thermal diffusion, or the like in a post deposition process step. During the doping process, whether insitu or post deposition, spacer element 28 protects resistor portion 24 from the doping and maintains the high resistivity nature of this portion of the polycrystalline silicon. The interconnection portions of the polycrystalline silicon thus include approximately 50 nanometers of lightly doped polycrystalline silicon overlaid by about 200 nanometers of heavily doped polycrystalline silicon to provide a high conductivity interconnection. The high conductivity interconnection is achieved, in accordance with the invention, without resorting to a precision photolithography masking operation to pattern the second layer of polycrystalline silicon.

Figure 6:
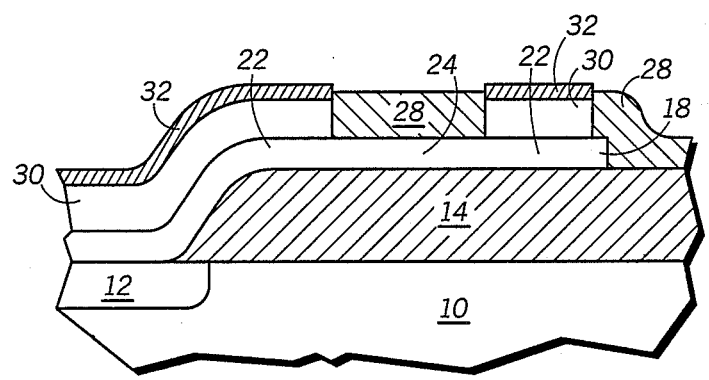

If even higher conductivity is required for the interconnection, the exposed surface of polycrystalline silicon layer 30 can be silicided by depositing a layer of a metal silicide forming material such as titanium, cobalt, or the like over the surface of the structure and heating to form a silicide layer 32 as illustrated in FIG. 6. The titanium or other silicide forming metal is easily removed from masking element 28 and insulator 14 because, in the absence of exposed silicon, no silicide forms and the titanium or other metal is easily removed in a metal etchant which does not etch the metal silicide. During the process of silicide formation the masking element 28 again protects the underlying resistor portion 24 from the silicide and preserves the high resistivity nature of this material.

Figure 7:
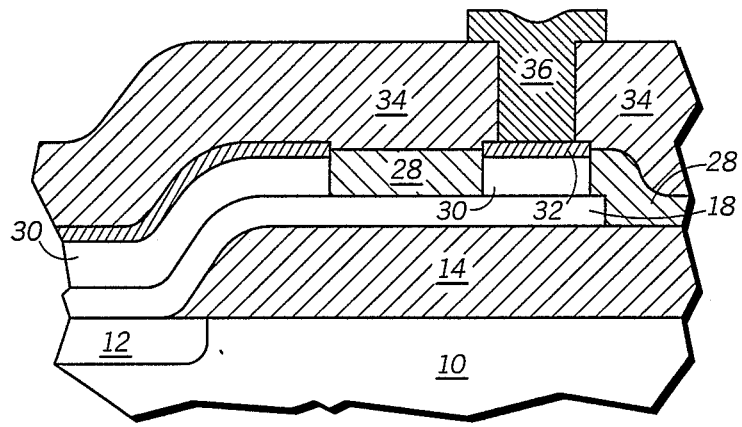

The structure is completed, as illustrated in FIG. 7, by depositing an additional layer of insulating material 34 overlaying the structure. An opening is etched through insulating layer 34 to expose a portion of silicide layer 32 in the area where electrical contact is desired to the silicided polycrystalline silicon interconnect. Aluminum, an aluminum alloy, or other metal or interconnecting material is deposited on the surface of insulator 34 and extending into the opening therethrough to contact the exposed silicided interconnecting material. The aluminum or other interconnecting material is patterned to form a contact 36 in conventional manner. Contact 36 is made to a relatively thick layer of silicided polycrystalline silicon so that reliable contact can be made. In contrast, contact to a thin layer of polycrystalline silicon might provide reliability problems as previously explained.

Thus it is apparent that there has been provided, in accordance with the invention, a process for forming integrated circuit resistors which fully meets the objects set forth above. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the integrated circuit resistor can be formed in series with an interconnecting layer of polycrystalline silicon which is contacted at both ends by a metalized interconnection, or which contacts device regions at either end. Further, the polycrystalline silicon resistor formed in accordance with the invention may be in series with a polycrystalline silicon gate electrode or the like. Accordingly, it is intended to encompass within the invention all such variations and modifications as fall within the scope of the appended claims.

I claim:

1. A process for fabricating a resistor in a semiconductor integrated circuit comprising the steps of:
   providing a semiconductor substrate;
   depositing a first thin layer of silicon overlaying said substrate;
   providing a predetermined level of conductivity determining dopant impurity in said first thin layer of silicon;
   patterning said first thin layer of silicon to form a first resistor area and a second interconnect area, said first and second areas being in contact;
   depositing a layer of insulating material overlaying said substrate and said first and second areas;
   patterning said layer of insulating material to expose said second interconnect area;
   depositing by selective deposition a second layer of silicon onto said exposed second interconnect area; and
   providing a predetermined level of conductivity determining dopant impurity in said second layer of silicon.

2. The process of claim 1 wherein said step of providing a predetermined level of conductivity determining dopant impurity in said first thin layer of silicon comprises a doping step selected from insitu doping during deposition, ion implantation, and thermal diffusion.

3. The process of claim 1 wherein said step of providing a predetermined level of conductivity determining dopant impurity in said second layer of silicon comprises a doping step selected from insitu doping during deposition, ion implantation, and thermal diffusion.

4. The process of claim 1 further comprising the step of forming a layer of a metal silicide on said second layer of silicon.

5. The process of claim 1 further comprising the step of providing a metal contact to said second layer of silicon.

6. The process of claim 1 wherein said second layer of silicon has a thickness greater than said first layer of silicon.

7. A process for fabricating a semiconductor device comprising the steps of:
   providing a semiconductor substrate having a surface and a device region formed at said surface;
   forming a first insulating layer overlaying said surface and having an opening therethrough exposing said device region;
   depositing a first layer of silicon overlaying said first insulating layer, extending into said opening to contact said device region, and having a first predetermined doping concentration;
   patterning said first layer of silicon to define a first resistor portion and a second interconnect portion;
   forming a second insulating layer overlaying said first and second portions;
   patterning said second insulating layer to expose said second portion;
   depositing by selective deposition a second layer of silicon overlaying said exposed second portions;
   doping said second layer of silicon; and
   forming a metal silicide contacting said second layer of silicon.

8. The process of claim 7 wherein said step of doping said second layer comprises doping to a second concentration greater than said first predetermined doping concentration.

9. The process of claim 7 wherein said step of depositing a first layer of silicon provides a first layer of first thickness and said step of selective deposition provides a second layer of silicon of second thickness greater than said first thickness.

10. The process of claim 7 further comprising the step of contacting said second layer with a deposited layer of metallization.

* * * * *